United States Patent
Chang

(10) Patent No.: US 12,429,765 B2
(45) Date of Patent: Sep. 30, 2025

(54) ANTI-GLARE LAYER AND MANUFACTURING METHOD THEREOF

(71) Applicant: E Ink Holdings Inc., Hsinchu (TW)

(72) Inventor: Chien-Hsing Chang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 398 days.

(21) Appl. No.: 18/170,563

(22) Filed: Feb. 17, 2023

(65) Prior Publication Data

US 2023/0350288 A1 Nov. 2, 2023

(30) Foreign Application Priority Data

Apr. 29, 2022 (TW) .................................. 111116365

(51) Int. Cl.
*G03F 7/00* (2006.01)
*G02B 1/11* (2015.01)

(52) U.S. Cl.
CPC .............. *G03F 7/0005* (2013.01); *G02B 1/11* (2013.01)

(58) Field of Classification Search
CPC ........... G03F 7/0005; G02B 1/11; G02B 1/00; G02B 1/04; G02B 1/10; G02B 1/111; G02B 1/14; G02B 1/18; G02B 5/02; G02B 5/0268; G02B 5/0294; G02B 27/0006
USPC ............... 359/601, 507, 599, 602, 603, 609; 428/141, 142, 156, 212, 213; 355/67, 71
See application file for complete search history.

(56) References Cited

U.S. PATENT DOCUMENTS

| | | | |
|---|---|---|---|
| 5,475,533 A | * | 12/1995 | Steenblik .................. G02B 5/00 359/623 |
| 7,208,423 B2 | | 4/2007 | Hashimoto et al. |
| 8,163,611 B2 | | 4/2012 | Hashimoto et al. |
| 8,450,048 B2 | | 5/2013 | Hatakeyama et al. |
| 9,588,263 B2 | | 3/2017 | Gollier et al. |
| 9,701,579 B2 | | 7/2017 | Gollier et al. |
| 9,880,328 B2 | | 1/2018 | Gollier et al. |
| 10,928,563 B2 | | 2/2021 | Naismith et al. |
| 2007/0184260 A1 | | 8/2007 | Saito et al. |
| 2014/0261677 A1 | | 9/2014 | Sakamoto et al. |
| 2015/0167921 A1 | | 6/2015 | Gollier et al. |
| 2015/0331149 A1 | | 11/2015 | Bookbinder et al. |
| 2018/0059501 A1 | | 3/2018 | Ouderkirk et al. |
| 2018/0251398 A1 | | 9/2018 | Ikegami et al. |

FOREIGN PATENT DOCUMENTS

| | | |
|---|---|---|
| TW | 552467 | 9/2003 |
| TW | 200516276 | 5/2005 |

OTHER PUBLICATIONS

"Office Action of Taiwan Counterpart Application", issued on Mar. 3, 2023, p. 1-p. 8.

* cited by examiner

*Primary Examiner* — Arnel C Lavarias
(74) *Attorney, Agent, or Firm* — JCIPRNET

(57) ABSTRACT

An anti-glare layer and a manufacturing method thereof are provided. The manufacturing method of the anti-glare layer includes providing a substrate, coating an anti-glare material layer on the substrate, and performing a photolithography process on the anti-glare material layer through a gray-scale mask to form the anti-glare layer. The anti-glare layer includes multiple protrusion portions with different heights.

17 Claims, 2 Drawing Sheets

ANTI-GLARE LAYER AND MANUFACTURING METHOD THEREOF

CROSS-REFERENCE TO RELATED APPLICATION

This application claims the priority benefit of Taiwan application serial no. 111116365, filed on Apr. 29, 2022. The entirety of the above-mentioned patent application is hereby incorporated by reference herein and made a part of this specification.

BACKGROUND

Technical Field

The disclosure relates to an anti-glare surface and a manufacturing method thereof, and more particularly, to an anti-glare layer and a manufacturing method thereof.

Description of Related Art

Generally speaking, an anti-glare layer is usually disposed on a surface of a display device to reduce the visual discomfort caused by the glare of a user. As a result, the overall experience of the display device is reduced. A common manufacturing method of the anti-glare layer includes spraying particles or imprinting steel plates to form an uneven structure on the surface to diffuse light, thereby achieving the anti-glare effect. However, for the anti-glare layer manufactured by spraying particles, it is impossible to generate the anti-glare layer with the same surface structure and surface roughness due to random distribution of the particles, resulting in unstable quality of the anti-glare layer. In addition, for the anti-glare layer manufactured by imprinting the steel plates, although the imprinted steel plates have a fixed pattern, the imprinted material is fluid. Therefore, the imprinted pattern is different each time, and it is also impossible to generate the anti-glare layer with the same surface structure and surface roughness, resulting in the unstable quality of the anti-glare layer.

SUMMARY

The disclosure provides an anti-glare layer and a manufacturing method thereof, which is easy to quantify, and enable a structure of the anti-glare layer to be reproducible, thereby stabilizing quality of the anti-glare layer.

In the disclosure, a manufacturing method of an anti-glare layer includes the following. A substrate is provided. An anti-glare material layer is coated on the substrate. A photolithography process is performed on the anti-glare material layer through a gray-scale mask to form the anti-glare layer. The anti-glare layer includes multiple protrusion portions with different heights.

In an embodiment of the disclosure, by the photolithography process, a continuous portion of the anti-glare layer is further formed, and the continuous portion extends continuously between the protrusion portions.

In an embodiment of the disclosure, by the photolithography process, the protrusion portions of the anti-glare layer are further separated.

In an embodiment of the disclosure, by the photolithography process, the anti-glare layer is further formed to have surface roughness between 0.5 μm and 2 μm.

In an embodiment of the disclosure, by the photolithography process, the adjacent protrusion portions of the anti-glare layer are further separated by a distance less than 1 mm.

In an embodiment of the disclosure, by the photolithography process, the protrusion portions of the anti-glare layer are further formed to have a height between 0.1 μm and 10 μm or an aspect ratio between 0 and 1.

In an embodiment of the disclosure, a material of the protrusion portions includes a photosensitive resin.

In an embodiment of the disclosure, by the photolithography process, the protrusion portions of the anti-glare layer are further formed to have a cross-sectional shape comprising a rectangle or a trapezoid.

In an embodiment of the disclosure, the gray-scale mask includes at least four areas with different light transmittances.

In an embodiment of the disclosure, by the photolithography process, the protrusion portions of the anti-glare layer are further formed to include at least four different heights respectively corresponding to the at least four areas with different light transmittances of the gray-scale mask.

In an embodiment of the disclosure, the manufacturing method further includes the following. The anti-glare layer is disposed on an external surface of an electronic device, and the protrusion portions protrude outward.

In the disclosure, an anti-glare layer includes a substrate and multiple protrusion portions. The protrusion portions are disposed on the substrate. The protrusion portions are manufactured by a photolithography process, and a separation distance of the adjacent protrusion portions is less than 1 mm.

In an embodiment of the disclosure, the anti-glare layer further includes a continuous portion disposed on the substrate and extending continuously between the protrusion portions.

In an embodiment of the disclosure, surface roughness of the anti-glare layer is between 0.5 μm and 2 μm.

In an embodiment of the disclosure, the protrusion portions have at least four different heights.

In an embodiment of the disclosure, a height of the protrusion portions is between 0.1 μm and 10 μm, or an aspect ratio is between 0 and 1.

In an embodiment of the disclosure, a material of the protrusion portions comprises a photosensitive resin.

In an embodiment of the disclosure, the protrusion portions have a cross-sectional shape including a rectangle or a trapezoid.

Based on the above, in the disclosure, the anti-glare layer is manufactured by the photolithography process using the gray-scale mask, so that the anti-glare layer manufactured each time has the same surface structure and surface roughness. That is, the structure of the anti-glare layer may be reproducible and easy to quantify. As a result, the quality of the anti-glare layer is stabilized.

DETAILED DESCRIPTION OF DISCLOSED EMBODIMENTS

Figure 1:
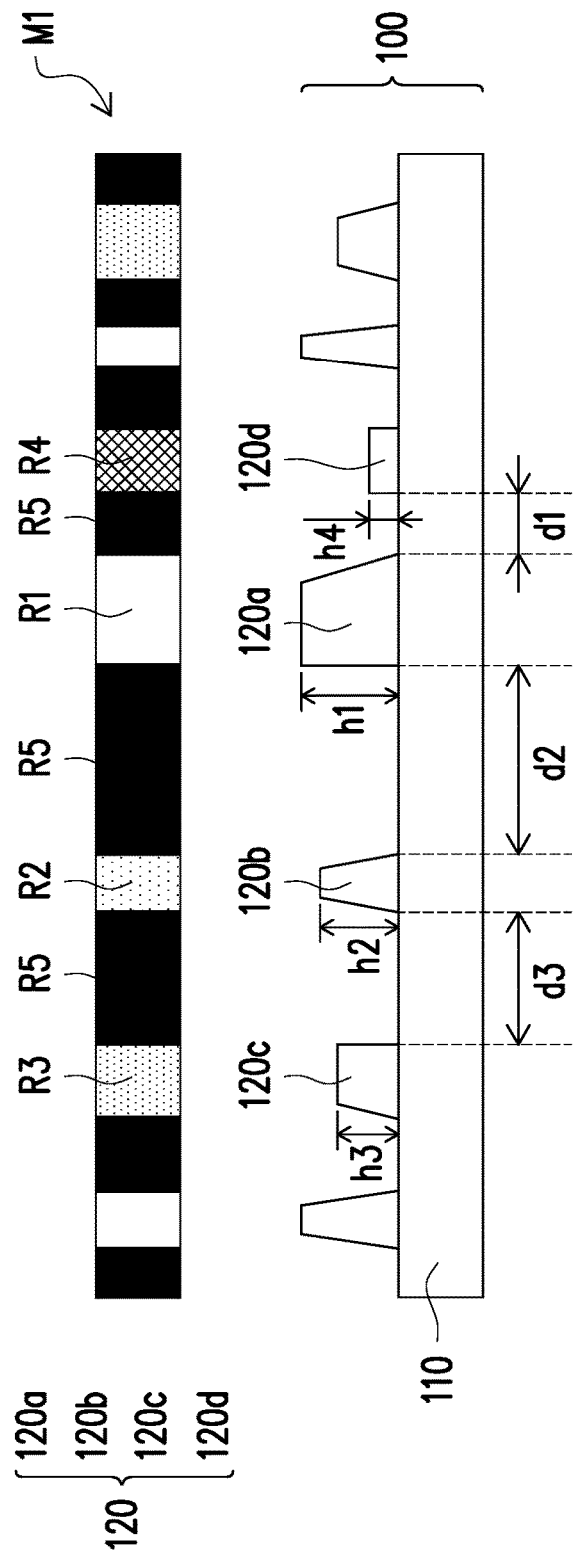
FIGS. 1 to 2 are schematic cross-sectional views of a manufacturing process of an anti-glare layer according to an embodiment of the disclosure.
Figure 2:
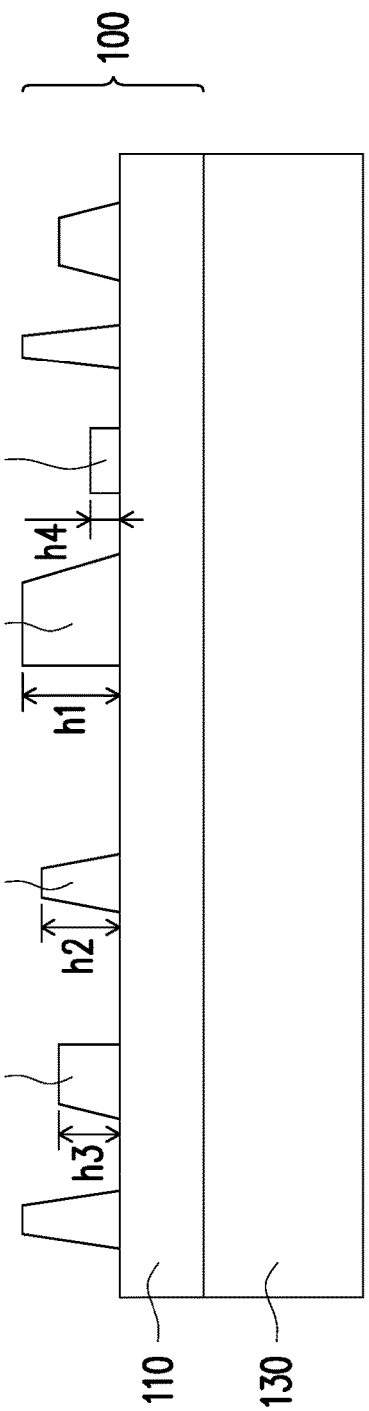

FIGS. 1 to 2 are schematic cross-sectional views of a manufacturing process of an anti-glare layer according to an embodiment of the disclosure.

Referring to FIG. 1, first, a substrate 110 is provided, and the substrate 110 may be a light-transmitting substrate. For example, a material of the substrate 110 may be polyethylene terephthalate (PET), poly (methyl methacrylate) (PMMA), polycarbonate (PC), polyimide (PI), a polymer matrix composite (PMC), glass, or other suitable light-transmitting materials. In an embodiment, the substrate 110 may also be an external substrate of an electronic device, such as a protective cover plate of a display device, and the disclosure is not limited thereto.

Continuing to refer to FIG. 1, an anti-glare material layer (not shown) is coated on the substrate 110, and a photolithography process is performed on the anti-glare material layer through a gray-scale mask M1 to form an anti-glare layer 100. The anti-glare layer 100 includes multiple protrusion portions 120 with different heights. For example, the anti-glare material layer may be formed on the substrate 110 by spin coating. The anti-glare material layer (or the protrusion portions 120) may be the light-transmitting material, and a material thereof includes a photosensitive resin, such as a photoresist. However, the disclosure is not limited thereto.

The gray-scale mask M1 includes at least four areas with different light transmittances, so that at least four protrusion portions 120 with different heights are generated on the substrate 110 at the same time after the photolithography process is performed on the anti-glare material layer. For example, in this embodiment, the gray-scale mask M1 includes a first area R1, a second area R2, a third area R3, a fourth area R4, and a fifth area R5. A light transmittance of the first area R1 is greater than a light transmittance of the second area R2. The light transmittance of the second area R2 is greater than a light transmittance of the third area R3. The light transmittance of the third area R3 is greater than a light transmittance of the fourth area R4. The light transmittance of the fourth area R4 is greater than a light transmittance of the fifth area R5. The fifth area R5 is an opaque area, that is, the light transmittance of the fifth area R5 is zero. Taking the anti-glare material layer as a negative photoresist as an example, the less the light transmittance of the area in the gray-scale mask M1, the easier the corresponding anti-glare material layer is to be etched. On the contrary, the greater the light transmittance of the area in the gray-scale mask M1, the more possible the corresponding anti-glare material layer is to be retained. That is to say, when the anti-glare material layer is the negative photoresist, during the photolithography process, the anti-glare material layer corresponding to the fifth area R5 is completely etched, and the anti-glare material layer corresponding to the first area R1, the second area R2, the third area R3, and the fourth area R4 form protrusion portions 120a, 120b, 120c, and 120d correspondingly according to the light transmittances of the corresponding areas. The protrusion portion 120a has a first height h1. The protrusion portion 120b has a second height h2. The protrusion portion 120c has a third height h3. The protrusion portion 120d has a fourth height h4. In addition, the first height h1 is greater than the second height h2. The second height h2 is greater than the third height h3. The third height h3 is greater than fourth height h4. Herein, the height of the protrusion portion 120 refers to a distance from a top surface of the protrusion portion 120 to a top surface of the substrate 110. In this embodiment, the heights of the four protrusion portions 120 are merely schematically shown, but are not intended to limit the disclosure. The heights of the protrusion portions 120 may be more varied according to a design of the gray-scale mask M1, and may be adjusted according to actual requirements.

In this embodiment, the first area R1, the second area R2, the third area R3, and the fourth area R4 of the gray-scale mask M1 are not adjacent to one another. For example, in FIG. 1, the first area R1 and the second area R2 are separated by the fifth area R5. The second area R2 and the third area R3 are separated by the fifth area R5. The first area R1 and the fourth area R4 are separated by the fifth area R5. In this way, the adjacent protrusion portions 120 may be completely separated by the photolithography process performed through the gray-scale mask, so that the anti-glare layer 100 has the disconnected protrusion portions. However, the disclosure is not limited thereto, and in other embodiments, the anti-glare layer 100 may also have the connected protrusion portions.

In an embodiment, the anti-glare layer 100 may be formed to have surface roughness between 0.5 and 2 μm by the photolithography process, so that the anti-glare layer 100 has a better anti-glare effect, and may effectively prevent marks of fingerprints from being left on the surface of the anti-glare layer 100. For example, the height of the protrusion portions 120 may be between 0.1 μm and 10 and aspect ratios of the protrusion portions 120 may be between 0 and 1.

In an embodiment, the adjacent protrusion portions 120 may be separated by a distance less than 1 mm by the photolithography process. For example, in FIG. 1, the adjacent protrusion portions 120d and 120a are separated by a first distance d1; the adjacent protrusion portions 120a and 120b are separated by a second distance d2, and the adjacent protrusion portions 120b and 120c are separated by a third distance d3. The first distance d1, the second distance d2, and third distance d3 are all different, but are all less than 1 mm. In this embodiment, the first distance d1, the second distance d2, and third distance d3 are merely schematically shown, but are not intended to limit the disclosure. The separation distances between the adjacent protrusion portions 120 may be more varied, and may be adjusted according to the actual requirements.

In an embodiment, the protrusion portions 120 of the anti-glare layer 100 may be formed to have a cross-sectional shape including a rectangle or a trapezoid by the photolithography process. For example, in FIG. 1, the cross-sectional shape of the protrusion portions 120a and 120c is a right-angled trapezoid, which has one side vertically connecting two parallel edges. The cross-sectional shape of the protrusion portion 120b is an isosceles trapezoid, which has two sides with substantially equal lengths. The cross-sectional shape of the protrusion portion 120d is a rectangle. In this embodiment, an example in which the protrusion portions 120 have the rectangular or trapezoidal cross-sections is merely schematically shown, but is not intended to limit the disclosure. The cross-sectional shapes of the protrusion portions 120 may be more varied, and may be adjusted according to the actual requirements.

The disclosure does not limit the shape, separation distance, or height of the protrusion portions 120. However, the protrusion portions 120 of the anti-glare layer 100 may have various shapes, separation distances, and heights, so that incident light or reflective light may be effectively dispersed, thereby achieving the anti-glare effect.

After the above manufacturing process, the anti-glare layer 100 may be substantially manufactured.

The anti-glare layer 100 includes the substrate 110 and the protrusion portions 120. The protrusion portions 120 are disposed on the substrate 110. The protrusion portions are manufactured by the photolithography process, and the separation distance of the adjacent protrusion portions is less than 1 mm.

Since the protrusion portions 120 in this embodiment are manufactured by the photolithography process through the gray-scale mask M1, the protrusion portions 120 manufactured in different batches may basically have the same surface structure, so as to stabilize the surface roughness of the anti-glare layer 100. In other words, in this embodiment, a structure of the anti-glare layer 100 may be reproducible and easy to quantify. As a result, quality of the anti-glare layer is stabilized.

Referring to FIG. 2, the anti-glare layer 100 is disposed on an outer surface of an electronic device 130, and the protrusion portions 120 protrude outward. For example, the substrate 110 of the anti-glare layer 100 may be attached to the outer surface of the electronic device 130, so that the protrusion portions 120 protrude outward. The electronic device 130 is, for example, a display device, including a reflective display device, a backlight display device, and the like, and the disclosure is not limited thereto.

In an embodiment, the substrate 110 of the anti-glare layer 100 may be an external substrate of the electronic device 130, so that an additional layer of substrate may be omitted on the external substrate of the electronic device 130. In other words, the protrusion portions 120 may be directly formed on the external substrate of the electronic device 130 without attaching the anti-glare layer 100 to the external substrate of the electronic device 130 through the additional substrate 110.

Figure 3:
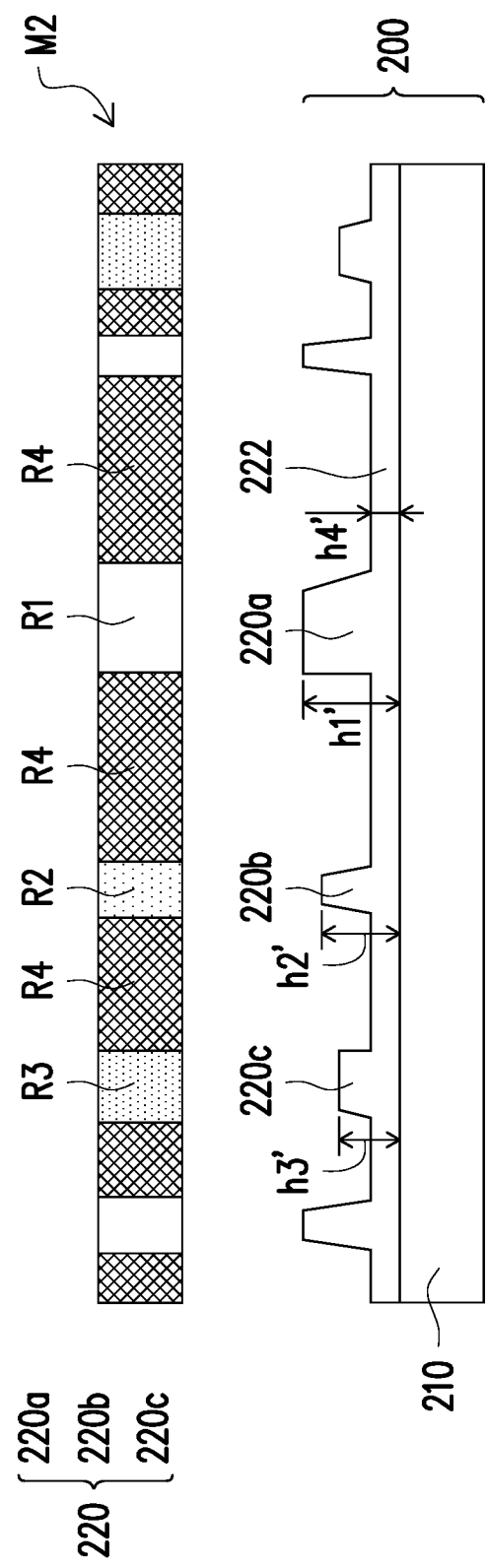
FIG. 3 is a schematic cross-sectional view of a manufacturing process of an anti-glare layer according to another embodiment of the disclosure.

FIG. 3 is a schematic cross-sectional view of a manufacturing process of an anti-glare layer according to another embodiment of the disclosure. The manufacturing process in this embodiment is substantially similar to the manufacturing process in FIG. 1. The same or similar elements will be denoted by the same or similar reference numerals (for example, the substrate 110 in FIG. 1 is similar to a substrate 210 in FIG. 3; the protrusion portions 120 in FIG. 1 are similar to protrusion portions 220 in FIG. 3, and the gray-scale mask M1 in FIG. 1 is similar to a gray-scale mask M2 in FIG. 3, etc.), and descriptions of the same technical contents are omitted. The aforementioned embodiment may be referred for descriptions of the omitted parts, and detailed descriptions thereof are not repeated in the following embodiment.

Referring to FIG. 3, the substrate 210 is provided, and the substrate 210 may be a light-transmitting substrate. For example, a material of the substrate 210 may be polyethylene terephthalate (PET), poly (methyl methacrylate) (PMMA), polycarbonate (PC), polyimide (PI), a polymer matrix composite (PMC), glass, or other suitable light-transmitting materials. In an embodiment, the substrate 210 may also be the external substrate of the electronic device, such as the protective cover plate, and the disclosure is not limited thereto.

Continuing to refer to FIG. 3, the anti-glare material layer (not shown) is coated on the substrate 210, and the photolithography process is performed on the anti-glare material layer through the gray-scale mask M2 to form an anti-glare layer 200. For example, the anti-glare material layer may be formed on the substrate 210 by spin coating. The anti-glare material layer (or the protrusion portions 220 and a continuous portion 222 described below) may be the light-transmitting material, and a material thereof includes the photosensitive resin, such as the photoresist. However, the disclosure is not limited thereto.

A manufacturing method of this embodiment is different from that of the embodiment in FIG. 1 in that the anti-glare layer 200 of this embodiment may form the protrusion portions 220 with different heights and the continuous portion 222 through the photolithography process. The continuous portion 222 may extend continuously between the protrusion portions 220, so that the anti-glare layer 200 has the connected protrusion portions.

In this embodiment, the gray-scale mask M2 includes at least four areas with different light transmittances, so that at least four protrusion portions 220 with different heights or the continuous portion 222 are generated on the substrate 210 at the same time after the photolithography process is performed on the anti-glare material layer. For example, in this embodiment, the gray-scale mask M2 does not have the opaque area, and includes the first area R1, the second area R2, the third area R3, the fourth area R4. The light transmittance of the first area R1 is greater than that of the second area R2. The light transmittance of the second area R2 is greater than that of the third area R3. The light transmittance of the third area R3 is greater than that of the fourth area R4. When the anti-glare material layer is the negative photoresist, during the photolithography process, the anti-glare material layer corresponding to the first area R1, the second area R2, and the third area R3 form protrusion portions 220a, 220b, and 220c correspondingly according to the light transmittances of the corresponding areas, and the anti-glare material layer corresponding to the fourth area R4 form the continuous portion 222 correspondingly. The protrusion portion 220a has a first height h1'. The protrusion portion 220b has a second height h2'. The protrusion portion 220c has a third height h3'. The continuous portion 222 has a fourth height h4'. In addition, the first height h1' is greater than the second height h2'. The second height h2' is greater than the third height h3'. The third height h3' is greater than the fourth height h4'. Herein, the height of the protrusion portion 220 refers to a distance from a top surface of the protrusion portion 220 to a top surface of the substrate 210, and the height of the continuous portion 222 refers to a distance from a top surface of the continuous portion 222 to the top surface of the substrate 210.

In an embodiment, the first area R1, the second area R2, and the third area R3 of the gray-scale mask M2 are not adjacent to one another. For example, in FIG. 3, the first area R1 and the second area R2 are separated by the fourth area R4, and the second area R2 and the third area R3 are separated by the fourth area R4. In this way, the continuous portion 222 may be formed between the adjacent protrusion portions 220 by the photolithography process performed through the gray-scale mask M2, and the height of the continuous portion 222 may be less than the height of the protrusion portions 220, so that the adjacent protrusion portions 220 may be connected through the continuous portion 222 and protrude from the continuous portion 222, and the anti-glare layer 200 has the connected protrusion portions.

In an embodiment, the anti-glare layer 200 may be attached to the external surface of the electronic device (not shown) by the manufacturing method in the embodiment of FIG. 2, and the protrusion portions 220 protrude outward. However, the disclosure is not limited thereto. The protrusion portions 220 may also be directly formed on the external substrate of the electronic device without attaching the anti-glare layer 200 to the external substrate of the electronic device through the additional substrate 210.

After the above manufacturing process, the anti-glare layer 200 may be substantially manufactured.

The anti-glare layer 200 includes the substrate 210, the protrusion portions 220, and the continuous portion 222. The protrusion portions 220 are disposed on the substrate 210. The protrusion portions are manufactured by the photolithography process, and the separation distance of the adjacent protrusion portions is less than 1 mm. The continuous portion 222 is disposed on the substrate 210, and extends continuously between the protrusion portions 220, so that the anti-glare layer 200 has the connected protrusion portions. In an embodiment, the height of the continuous portion 222 is less than the height of the protrusion portions 220.

Since the protrusion portions 220 in this embodiment are manufactured by the photolithography process through the gray-scale mask M2, the protrusion portions 220 manufactured in different batches may basically have the same surface structure, so as to stabilize surface roughness of the anti-glare layer 200. In other words, in this embodiment, a structure of the anti-glare layer 200 may be reproducible and easy to quantify. As a result, the quality of the anti-glare layer is stabilized.

Based on the above, in the disclosure, the anti-glare layer is manufactured by the photolithography process using the gray-scale mask, so that the anti-glare layer manufactured each time has the same surface structure and surface roughness. That is, the structure of the anti-glare layer may be reproducible and easy to quantify. As a result, the quality of the anti-glare layer is stabilized.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A manufacturing method of an anti-glare layer, comprising:
   providing a substrate;
   coating an anti-glare material layer on the substrate; and
   performing a single photolithography process on the anti-glare material layer through a gray-scale mask to form the anti-glare layer, wherein the anti-glare layer comprises a plurality of protrusion portions with different heights.

2. The manufacturing method of the anti-glare layer according to claim 1, wherein by the single photolithography process, a continuous portion of the anti-glare layer is further formed, and the continuous portion extends continuously between the protrusion portions.

3. The manufacturing method of the anti-glare layer according to claim 1, wherein by the single photolithography process, the protrusion portions of the anti-glare layer are further separated.

4. The manufacturing method of the anti-glare layer according to claim 1, wherein by the single photolithography process, the anti-glare layer is further formed to have surface roughness between 0.5 µm and 2 µm.

5. The manufacturing method of the anti-glare layer according to claim 1, wherein by the single photolithography process, adjacent protrusion portions of the plurality of protrusion portions of the anti-glare layer are further separated by a distance less than 1 mm.

6. The manufacturing method of the anti-glare layer according to claim 1, wherein by the single photolithography process, the protrusion portions of the anti-glare layer are further formed to have a height between 0.1 µm and 10 µm or an aspect ratio between 0 and 1.

7. The manufacturing method of the anti-glare layer according to claim 1, wherein a material of the protrusion portions comprises a photosensitive resin.

8. The manufacturing method of the anti-glare layer according to claim 1, wherein by the single photolithography process, the protrusion portions of the anti-glare layer are further formed to have a cross-sectional shape comprising a rectangle or a trapezoid.

9. The manufacturing method of the anti-glare layer according to claim 1, wherein the gray-scale mask comprises at least four areas with different light transmittances.

10. The manufacturing method of the anti-glare layer according to claim 9, wherein by the single photolithography process, the protrusion portions of the anti-glare layer are further formed to comprise at least four different heights respectively corresponding to the at least four areas with different light transmittances of the gray-scale mask.

11. The manufacturing method of the anti-glare layer according to claim 1, further comprising disposing the anti-glare layer on an external surface of an electronic device, wherein the protrusion portions protrude outward.

12. An anti-glare layer, comprising:
    a substrate; and
    a plurality of protrusion portions disposed on the substrate, wherein the protrusion portions are manufactured by a photolithography process, and a separation distance of adjacent protrusion portions of the plurality of protrusion portions is less than 1 mm,
    wherein a surface roughness of the anti-glare layer is between 0.5 µm and 2 µm.

13. The anti-glare layer according to claim 12, further comprising:
    a continuous portion disposed on the substrate and extending continuously between the protrusion portions.

14. The anti-glare layer according to claim 12, wherein the protrusion portions have at least four different heights.

15. The anti-glare layer according to claim 12, wherein a height of the protrusion portions is between 0.1 µm and 10 µm, or an aspect ratio is between 0 and 1.

16. The anti-glare layer according to claim 12, wherein a material of the protrusion portions comprises a photosensitive resin.

17. The anti-glare layer according to claim 12, wherein the protrusion portions have a cross-sectional shape comprising a rectangle or a trapezoid.

* * * * *